United States Patent
Chien

(10) Patent No.: US 7,173,309 B2
(45) Date of Patent: Feb. 6, 2007

(54) SOI SINGLE CRYSTALLINE CHIP STRUCTURE WITH MULTI-THICKNESS SILICON LAYER

(75) Inventor: Ray Chien, Hsin Tien (TW)

(73) Assignee: Via Technologies Inc., Taipei Hsien (TW)

( * ) Notice: Subject to any disclaimer, the term of this patent is extended or adjusted under 35 U.S.C. 154(b) by 197 days.

(21) Appl. No.: 10/834,263

(22) Filed: Apr. 29, 2004

(65) Prior Publication Data
US 2004/0217438 A1 Nov. 4, 2004

(30) Foreign Application Priority Data
Apr. 29, 2003  (CN)  .................... 03246541
Apr. 29, 2003  (CN)  .................... 03246542

(51) Int. Cl.
*H01L 27/01* (2006.01)

(52) U.S. Cl. ................ 257/347; 257/499; 257/E21.563

(58) Field of Classification Search ................ 257/499, 257/347, 301, 302, 329, 330, 350, 349, 352, 257/353, 354, E27.112, E21.563; 438/405, 438/407
See application file for complete search history.

(56) References Cited

U.S. PATENT DOCUMENTS

| 5,476,819 | A  | * | 12/1995 | Warren          | 438/456 |
| 6,063,652 | A  | * | 5/2000  | Kim             | 438/155 |
| 6,333,532 | B1 | * | 12/2001 | Davari et al.   | 257/301 |
| 6,384,422 | B2 | * | 5/2002  | Shimoji         | 257/9   |
| 6,462,428 | B2 | * | 10/2002 | Iwamatsu        | 257/797 |

* cited by examiner

*Primary Examiner*—Nathan J. Flynn
*Assistant Examiner*—Benjamin Tzu-Hung Liu
(74) *Attorney, Agent, or Firm*—Birch, Stewart, Kolasch and Birch, LLP

(57) ABSTRACT

A SOI (silicon on insulator) single crystalline chip structure is provided. The SOI chip structure has a first silicon layer for at least one SOI device to be placed thereon, at least one buried oxide area with a predetermined depth placed at a predetermined position of the first silicon layer in order to enable the first silicon layer to have at least two different silicon layer thicknesses. The buried oxide area is filled with a silicon oxide material serving as an insulating area, and a second silicon layer is located below the first silicon layer and the buried oxide area.

20 Claims, 8 Drawing Sheets

SOI SINGLE CRYSTALLINE CHIP STRUCTURE WITH MULTI-THICKNESS SILICON LAYER

This Non-provisional application claims priority under 35 U.S.C. §119 (a) on patent application Ser. No(s). 03246541.6 and 03246542.4 filed CHINA on Apr. 29, 2003, the entire contents of which are hereby incorporated by reference.

BACKGROUND OF THE INVENTION

1. Field of the Invention

The present invention relates to a SOI (silicon on insulator) single crystalline chip structure, and more particularly, to a SOI single crystalline chip structure incorporating at least two different silicon layer thicknesses therein.

2. Description of the Prior Art

Reference is made to FIG. 1, a schematic, cross-sectional view of a SOI single crystalline chip structure 10 according to the prior art. A SOI single crystalline chip structure, by definition, has a silicon-based active device layer on an insulator, such as a silicon oxide. The SOI single crystalline chip structure 10 includes an active device layer 12 for placing at least one SOI device thereon, an insulating layer 14 below the active device layer 12, and a ground layer 16 below the insulating layer 14. In general, the thickness of the active device layer d1 is uniform, indicating that this prior art SOI chip structure 10 is a single-thickness active layer SOI chip structure. The insulating layer 14 is always provided with a buried oxide layer (BOX), which is formed in a variety of ways, such as ion-implanting oxygen ions into the silicon target, and then placing the silicon target into a relatively high temperature environment, in order to form this BOX at the predetermined depth of the silicon target. As for the active device layer 12, d1 ranges between 0.03 and 10 micrometers.

However, as SOC (system on a chip) has gradually become the mainstream product in today's market, the same active device layer of the chip structure should be able to accommodate different types of SOI devices placed thereon. Each such SOI device may have its own characteristics such as size, dissipation requirement, operating current, or voltage demand, and an SOI chip structure only with a uniform silicon layer thickness thus encounters difficulty in satisfying all SOI devices. In other words, some SOI devices with higher operating voltages/currents and more heat dissipation preferably should be placed on a thicker silicon layer, while SOI devices with smaller operating voltages or less heat dissipation requirement somewhere on the active device layer without that thickness for former SOI devices is no problem. Even with a uniformly thick active device layer, the prior art SOI chip structure is still available when it comes to the placement of SOI devices with higher heat dissipation requirement or greater operating voltages, as long as each of them occupies a comparatively larger area, in order to avoid any potential malfunction due to its stricter demands. As the result, the amount of SOI device placement for any given single chip structure is lowered accordingly, which is not economically efficient. Besides, the resistance to electro static discharge (ESD) of SOI chip structure 10 is undermined given that the active layer 12 is not effectively grounded and the breakdown voltage for SOI devices is limited due to the uniform silicon layer thickness d1.

SUMMARY OF THE INVENTION

The objective of the present invention is to provide a SOI single crystalline chip structure having a silicon layer with at least two different thicknesses.

In the present invention, by forming buried oxide areas at predetermined positions of the first (silicon) wafer, the thickness of wafer in a vertical relation to the buried oxide area is not thicker than that of the wafer where no buried oxide area is formed in its vertical direction. The first wafer then is flipped and bonded to another handle wafer, i.e., the second wafer serving as a ground layer. Thereafter, the first wafer is sliced and a surface is disposed following the slicing, so as to form a SOI single crystalline chip structure at least having a dual-thickness silicon layer. Thereby, a variety of SOI devices are placed on this silicon layer without having the above concerns.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

Figure 1:
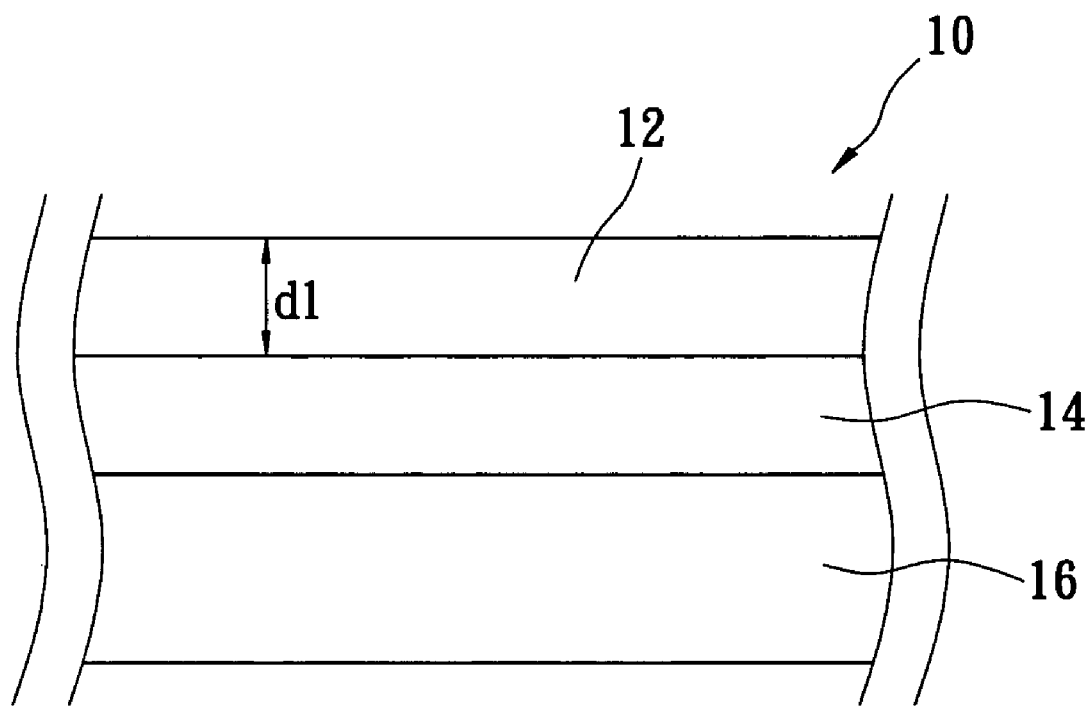
FIG. 1 is a schematic, cross-sectional view of a SOI single crystalline chip structure according to the prior art.
Figure 2:
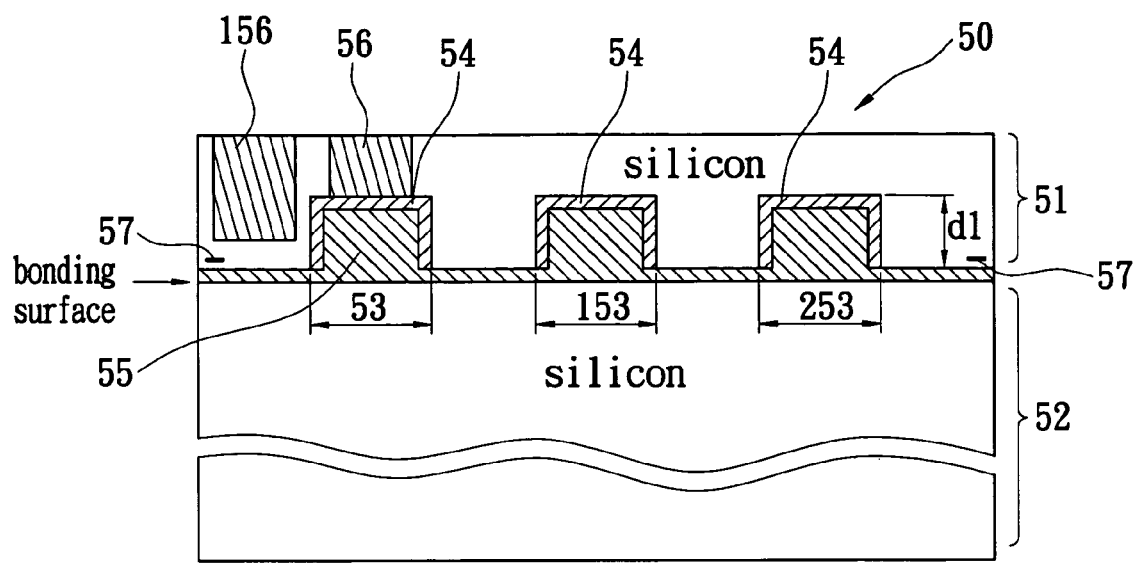
FIG. 2 is a schematic diagram illustrating a first embodiment according to the present invention.

Reference is made to FIG. 2, which is a schematic diagram illustrating a first embodiment 50 according to the present invention. The first embodiment 50 includes a first wafer 51 serving as the first layer and a second wafer 52 serving as the second layer (ground layer). Buried oxide areas 53, 153, and 253 with a predetermined depth d1 are formed at predetermined positions of the first silicon layer 51. These buried oxide areas 53, 153, and 253 are first filled with amorphous silicon oxide 54, and if the amorphous silicon oxide 54 does not fill the whole buried oxide areas 53, 153, and 253 and if after CMP polishing some excess amorphous silicon oxide remains outside buried oxide areas 53, 153, and 253, the aforementioned buried oxide areas are further filled with a metal layer 55, thereby establishing a direct electrical connection between the first and second wafers 51 and 52 through the metal layer 55. The first wafer 51 serves to place SOI devices 56 and 156 thereon, and with the placement of buried oxide areas 53, 153, and 253, SOI devices 56 and 156 located at different positions may retain corresponding different silicon layer thickness. Taking the buried oxide area 53 as an example, the SOI device 56 located directly there above obviously has a comparatively thin silicon layer thickness, as compared to the SOI device 156 not located directly above any buried oxide area. Consequently, this sort of SOI chip structure 50 is compatible with different SOI device demands, such as dissipation requirements or characteristic sizes. Thus, SOI devices are placed in the areas having the most appropriate heat dissipation and electro static resistance, and in this case, no compromise such as a lowering of the total number of dies in any given single wafer is made in exchange for placing all SOI devices thereon.

In addition, the first wafer 51 further includes at least one pair of alignment marks 57 placed thereon, in order to facilitate the forming (by lithographically etching) of buried oxide areas 53, 153, and 253. With the setting of alignment marks, the stepper and photo-mask thereof take these alignment marks as their reference while the buried oxide areas 53, 153, and 253 are formed at predetermined positions of the first wafer 51. The metal layer 55 is selected from a group consisting of a single-layer metal and a multi-layer metal compound.

Figure 3:
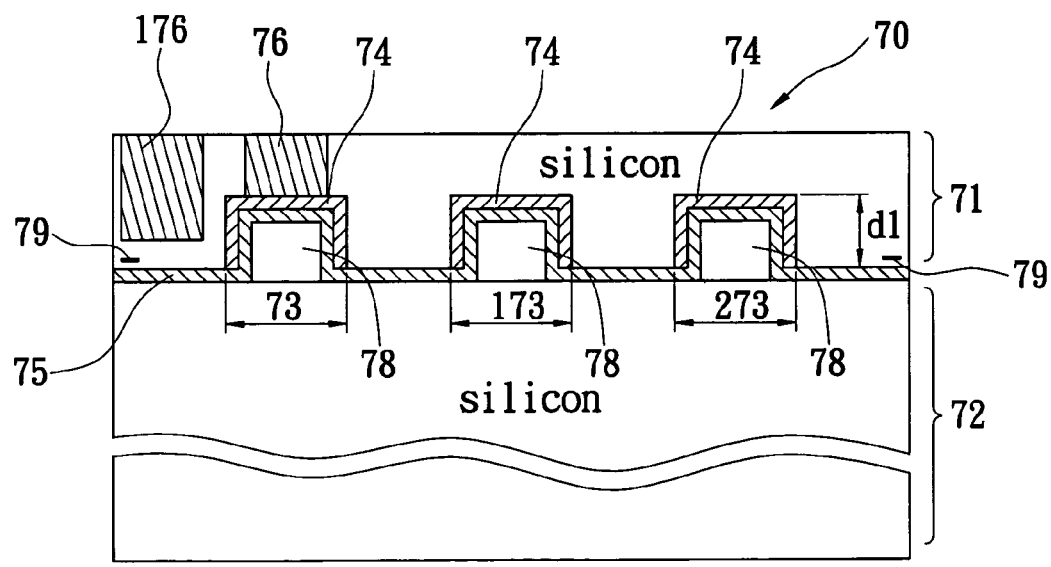
FIG. 3 is a schematic diagram illustrating a second embodiment according to the present invention.

Reference is made to FIG. 3, which is a schematic diagram showing a second embodiment 70 based on the present invention. The second embodiment 70 includes a first wafer 71 serving as the first layer and a second wafer 72 serving as the second layer (ground layer) as well. Buried oxide areas 73, 173, and 273 with a predetermined depth d1 are formed at predetermined positions of the first silicon layer 71. These buried oxide areas 73, 173, and 273 are first filled with amorphous silicon oxide 74, and when the amorphous silicon oxide 74 does not fill the whole buried oxide areas 73, 173, and 273 and some excess amorphous silicon oxide remains outside buried oxide areas 73, 173, and 273 after CMP, the aforementioned buried oxide areas are further filled with a metal layer 75, thereby establishing a direct electrical connection between the first and second wafers 71 and 72 through the metal layer 75. A comparison of the first embodiment 50 and second embodiment 70 reveals that the buried oxide areas 73, 173, and 273 are selectively not entirely filled by metal layer 75. Comparatively speaking, the cost of manufacturing the second embodiment 70 is than the first embodiment 50, given the lower usage of metal layer material. The remaining space of these buried oxide area 73, 173, and 273 are maintained in a vacuum when the first wafer 71 is bonded with the second wafer 72. In other words, vacuum void 78 is formed between buried oxide area metal layer 75 and second wafer 72. The first wafer 71 serves to place SOI devices 76 and 176 thereon, and with the placement of buried oxide areas 73, 173, and 273, SOI devices 76 and 176 located at different positions may retain corresponding different silicon layer thickness. Taking the buried oxide area 73 as an example, the SOI device 76 located directly above it obviously has a comparatively thin silicon layer thickness, as compared to the SOI device 176 not located directly above any buried oxide area. Consequently, this sort of SOI chip structure 70 is compatible with different SOI device demands, such as dissipation requirements or characteristic sizes. Thus, SOI devices are located in a place with the most appropriate heat dissipation and electro static resistance, and in this case, no compromise such as a lowering of the total number of dies in any given single wafer is made in exchange for placing all SOI devices thereon.

In addition, the first wafer 71 further includes at least one pair of alignment marks 79 placed thereon, in order to facilitate the forming (by lithographically etching) of buried oxide areas 73, 173, and 273. With the setting of alignment marks 79, the stepper and photo-mask thereof take these alignment marks as their reference while forming of buried oxide areas 73, 173, and 273 at predetermined positions of the first wafer 71. The metal layer 75 is either a single-layer metal or a multi-layer metal compound.

Figure 4:
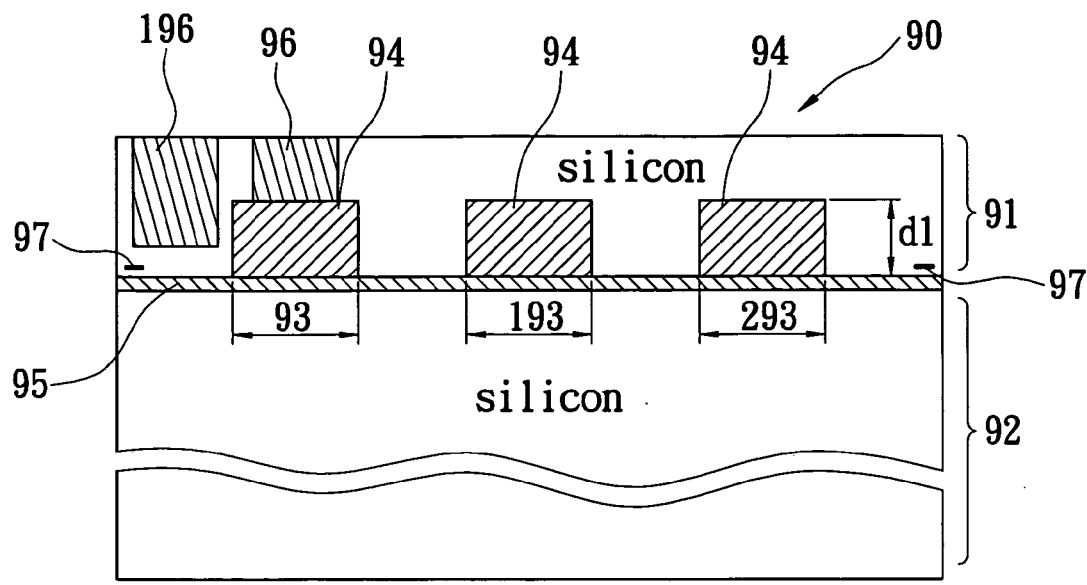
FIG. 4 is a schematic diagram illustrating a third embodiment according to the present invention.

Reference is made to FIG. 4, which is a schematic diagram showing a third embodiment 90 based on the present invention. The third embodiment 90 also includes a first wafer 91 serving as the first layer and a second wafer 92 serving as the second layer (ground layer). Buried oxide areas 93, 193, and 293 with a predetermined depth d1 are formed at predetermined positions of the first silicon layer 91. These buried oxide areas 93, 193, and 293 are entirely filled with amorphous silicon oxide 94, and thus the metal layer 95 only can be placed between the first and second wafer 91 and 92, as excessive amorphous silicon oxide 94 outside of these buried oxide areas 93, 193, and 293 is removed by CMP, rendering the electrical connection between the first and second wafers 91 and 92 possible. Similarly, the first wafer 91 serves to place SOI devices 96 and 196 thereon, and with the placement of buried oxide areas 93, 193, and 293, SOI devices 96 and 196 located at different positions may retain corresponding different silicon layer thickness. Compared with the SOI device 196, the SOI device 96, which is located directly above the buried oxide area 93, consequently has a comparatively thin silicon layer thickness. In this way, this sort of SOI chip structure 90 is compatible with different SOI device demands, such as dissipation requirements or characteristic sizes. Thus, SOI devices are located in places with the most appropriate heat dissipation and electro static resistance, and in this case, no compromise such as a lowering of the total number of dies in any given single wafer is made in exchange for placing all SOI devices thereon.

In addition, the first wafer 91 further includes at least one pair of alignment marks 97 placed thereon, in order to facilitate the forming (by lithographically etching) of buried oxide areas 93, 193, and 293. With the setting of alignment marks 97, the stepper and photo-mask thereof take these alignment marks as their reference while forming of buried oxide areas 93, 193, and 293 at predetermined positions of the first wafer 91. The metal layer 95 is a single-layer metal or a multi-layer metal compound.

Figure 5:
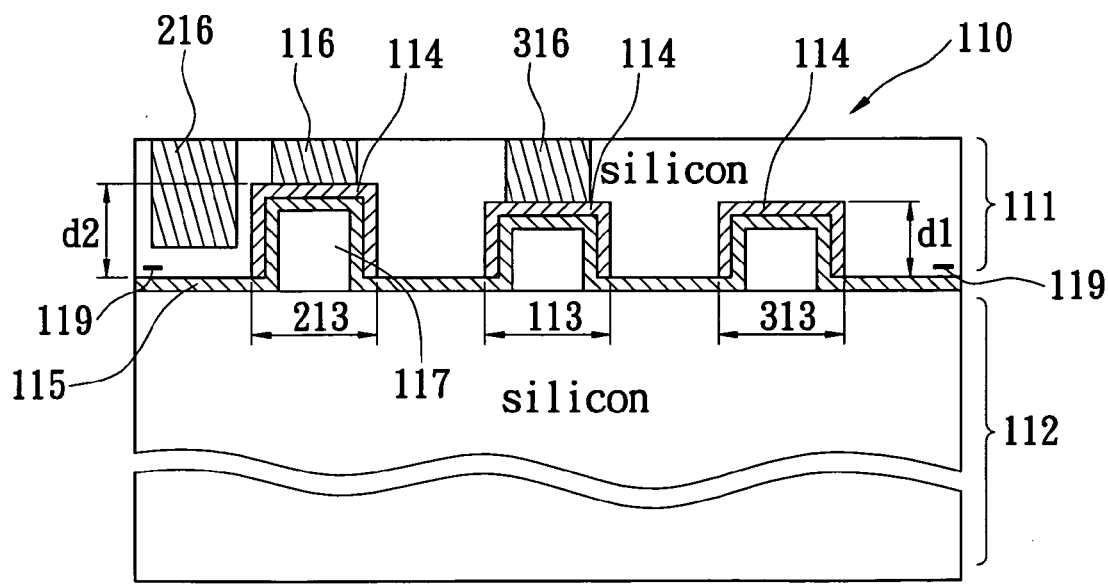
FIG. 5 is a schematic diagram illustrating a fourth embodiment according to the present invention.

Reference is made to FIG. 5, which is a schematic diagram showing a fourth embodiment 110 based on the present invention. In comparison with the embodiment 70 in FIG. 3, the major difference lies in the setting of buried oxide areas having depth selection other than d1. This embodiment 110 includes a first wafer 111 serving as the first layer and a second wafer 112 serving as the second layer (ground layer). Buried oxide areas 113 and 313 with the depth d1 are located at the first predetermined positions of the first wafer 111, while the buried oxide area 213 having a depth d2 is located at the second predetermined position of the first wafer 111. Buried oxide areas 113, 213, and 313 are not completely filled with amorphous silicon oxide 114, and thus the remaining space of these buried oxide areas 113, 213, and 313 is filled with the metal layer 115. Of course, excess amorphous silicon oxide 94 outside these buried oxide areas 113, 213, and 313 is removed with CMP before filling with the metal layer 115. Through the placement of metal layer 115, the first and second wafers 111 and 112 are directly electrically connected. With two different setting depths of the buried oxide areas, SOI devices 116, 216, and 316 placed on the first wafer 111 have three different silicon layer thicknesses according to where they are located. In this circumstance, this sort of SOI chip structure 110 is compatible with different SOI device demands. The metal layer 115 may not fill the remaining space of any given buried oxide area, meaning vacuum voids 117 are formed between the filled-to-the-buried oxide area metal layer 115 and the second wafer 112, in order to assure the wafer bonding between two wafers 111 and 112 is performed without any undesired consequence.

In addition, the first wafer 111 further includes at least one pair of alignment marks 119 placed thereon, in order to facilitate the forming (by lithographically etching) of buried oxide areas 113, 213, and 313. With the setting of alignment marks 119, the stepper and photo-mask thereof take these alignment marks as their reference while forming of buried oxide areas 113, 213, and 313 at predetermined positions of the first wafer 111. Embodiments 50, 70, or 90 may also choose to have buried oxide areas thereof with two (or more) depths.

Figure 6:
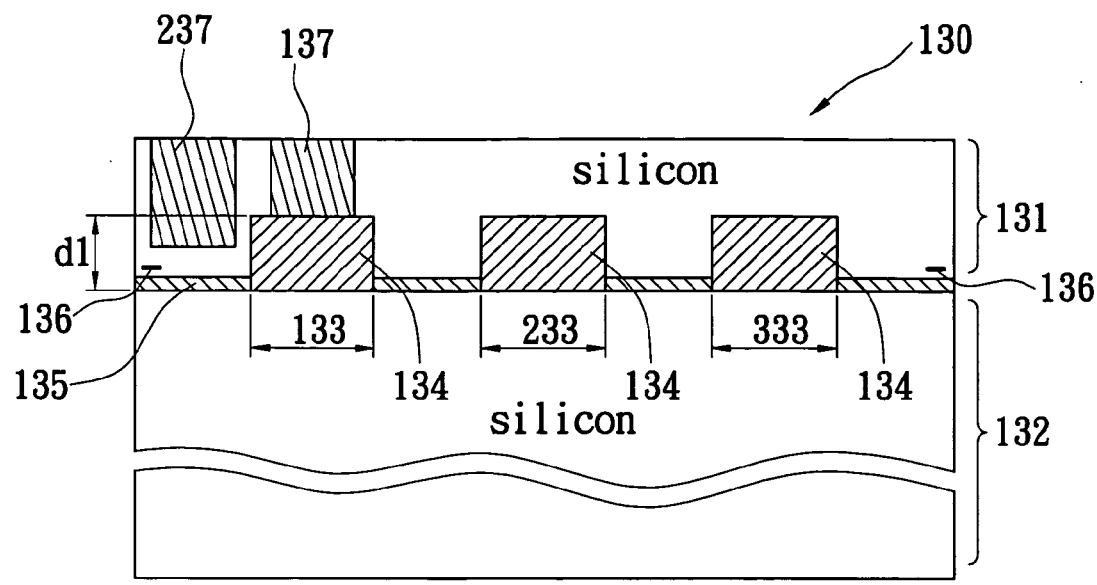
FIG. 6 is a schematic diagram illustrating a fifth embodiment according to the present invention.

Reference is made to FIG. 6, which is a schematic diagram showing a fifth embodiment 130 based on the present invention. The SOI chip structure 130 includes a first silicon layer (wafer) 131 and a second silicon layer (wafer) 132 under the first silicon layer 131 after being bonded with the first silicon layer 131. Buried oxide areas 133, 233, and 333 with the depth d1 are located at the predetermined positions of the first wafer 131, into which and an amorphous silicon oxide 134 is supposed to be filled. Meanwhile, an insulating layer 135, preferably a thermal oxide layer, is located between the first silicon layer 131 and the second silicon layer 132, leading to SOI devices 137 and 237 placed on the first silicon layer 131 further requiring the setting of via holes (not shown) so as to have operating voltages thereof refer to the second silicon layer (ground layer) 132. Also with the setting of these buried oxide areas 133, 233, and 333, this SOI chip structure 130 becomes a SOI chip structure with a dual-thickness silicon layer, rendering the placement of different kinds of SOI devices 137 and 237 appropriate. However, given that the first and second silicon layers 131 and 231 are separated from each other with some sort of insulating material, such as the fill-in amorphous silicon oxide 134 or insulating layer 135, the heat dissipation performances of SOI devices 137 and 237 are not as good as that of their counterparts placed on active device layers of SOI chip structures having conductive metal layers placed between the first and second silicon layers.

The first wafer 131 further includes at least one pair of alignment marks 136 placed thereon, in order to facilitate the forming (by lithographically etching) of buried oxide areas 133, 233, and 333. With the setting of alignment marks 119, the stepper and photo-mask thereof takes these alignment marks as their reference while forming buried oxide areas 133, 233, and 333 at predetermined positions of the first wafer 131.

Figure 7:
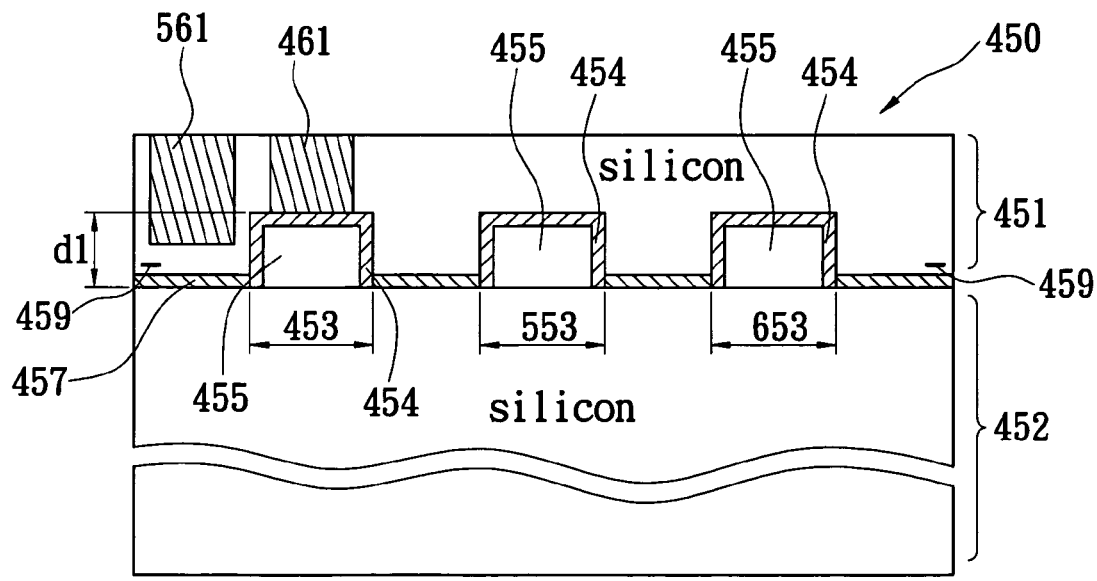
FIG. 7 is a schematic diagram illustrating a sixth embodiment according to the present invention.

Reference is made to FIG. 7 of a schematic diagram showing a sixth embodiment 450 based on the present invention. The SOI chip structure 450 includes a first silicon layer (wafer) 451 and a second silicon layer (wafer) 452 under the first silicon layer 451 after being bonded with the first silicon layer 451 together. Buried oxide areas 453, 553, and 653 with a depth d1 are located at the predetermined positions of the first wafer 451, and these buried oxide areas 453, 553, and 653 are supposed to be filled with an amorphous silicon oxide 454. In this embodiment, these buried oxide areas 453, 553, and 653 are not fully filled with amorphous silicon oxide 454, and the remaining spaces therein are provided with voids 455 between buried oxide areas 453, 553, and 653, and the second silicon layer 452, respectively. Meanwhile, an insulating layer 457, preferably a thermal oxide layer, is located between the first silicon layer 451 and the second silicon layer 452, leading to SOI devices 461 and 561 placed on the first silicon layer 451 further require the setting of via holes (not shown) so as to have operating voltages thereof refer to the second silicon layer (ground layer) 452. Also with the setting of these buried oxide areas 453, 553, and 653, this SOI chip structure 450 becomes a SOI chip structure with a dual-thickness silicon layer, rendering the placement of different kinds of SOI devices 461 and 561 appropriate. However, given the first and second silicon layers 451 and 561 are separated from each other with some sort of insulating material, such as the fill-in amorphous silicon oxide 454 or insulating layer 457, the heat dissipation performances of SOI devices 461 and 561 are not as good as their counterparts placed on active device layers of SOI chip structures having conductive metal layers placed between the first and second silicon layers.

The first wafer 451 further includes at least one pair of alignment marks 459 placed thereon, in order to facilitate the forming (by lithographically etching) of buried oxide areas 453, 553, and 653, as previously mentioned. Comparison to the embodiment in FIG. 6 reveals that the present embodiment 450, while able to lower manufacturing costs because the buried oxide areas thereof are not fully filled with the amorphous silicon oxide 454, provides SOI devices with heat dissipation performances lower than those of as their counterparts on SOI chip structure having no void formed, provided the heat dissipation capability of a vacuum is inferior to that of the amorphous silicon oxide, not to mention that of the metal layer.

Figure 8:
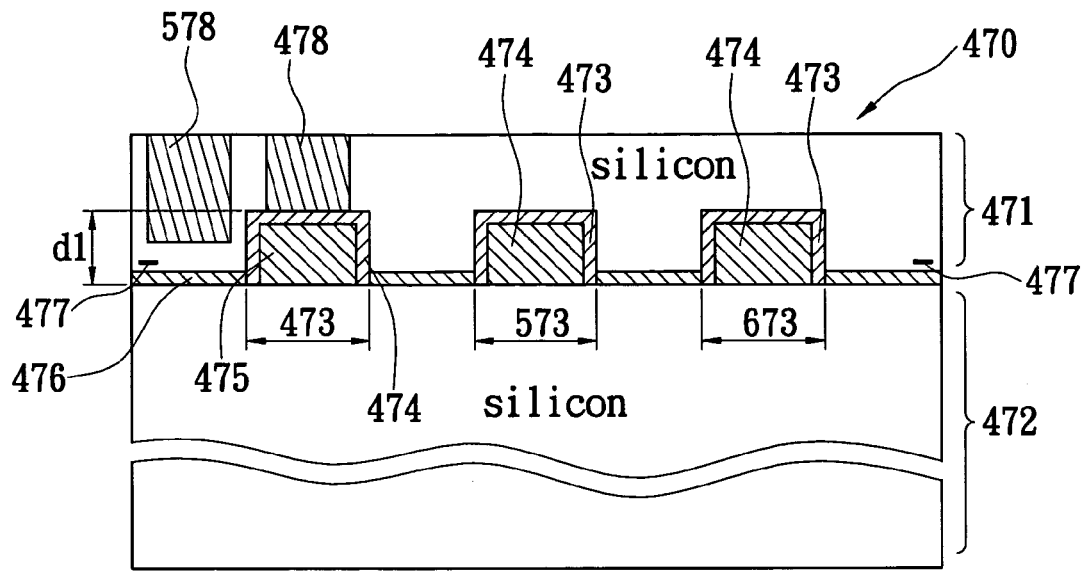
FIG. 8 is a schematic diagram illustrating a seventh embodiment according to the present invention.

Reference is made to FIG. 8, which is a schematic diagram showing a seventh embodiment 470 based on the present invention. The SOI chip structure 470 includes a first silicon layer (wafer) 471 and a second silicon layer (wafer) 472 under the first silicon layer 471 after being bonded with the first silicon layer 471. Buried oxide areas 473, 573, and 673 with the depth d1 are located at the predetermined positions of the first wafer 471, and buried oxide areas 473, 573, and 673 are supposed to be filled with an amorphous silicon oxide 474. In this embodiment, buried oxide areas 473, 573, and 673 are not fully filled with the amorphous silicon oxide 474, and the remaining spaces therein are provided with the metal layer 475. This embodiment 470 further includes an insulating layer 476, preferably a thermal oxide layer, between the first silicon layer 471 and the second silicon layer 472, leading to SOI devices 478 and 578 placed on the first silicon layer 471 further require the setting of via holes (not shown) so as to have operating voltages thereof refer to the second silicon layer (ground layer) 472. With the setting of these buried oxide areas 473, 573, and 673, this SOI chip structure 470 also becomes a SOI chip structure with a dual-thickness silicon layer, rendering the placement of different kinds of SOI devices 478 and 578 appropriate. As in the aforementioned embodiments, at least one pair of alignment marks 477 are included and placed on the first silicon layer 471. When compared with the embodiments shown in FIGS. 6 and 7, this embodiment, having buried oxide areas 453, 553, and 653 filled with the metal layer 475, has superior performances with regard to heat dissipation and grounding than its counterparts in the above two figures. While having the metal layer 475 formed, the whole process of manufacturing the present embodiment SOI chip structure 470 faces some problems like the planarization and interface between the metal layer 475 and second silicon layer 472. Additionally, the metal layer 475 is either a single-layer metal or a multi-layer metal compound.

Figure 9:
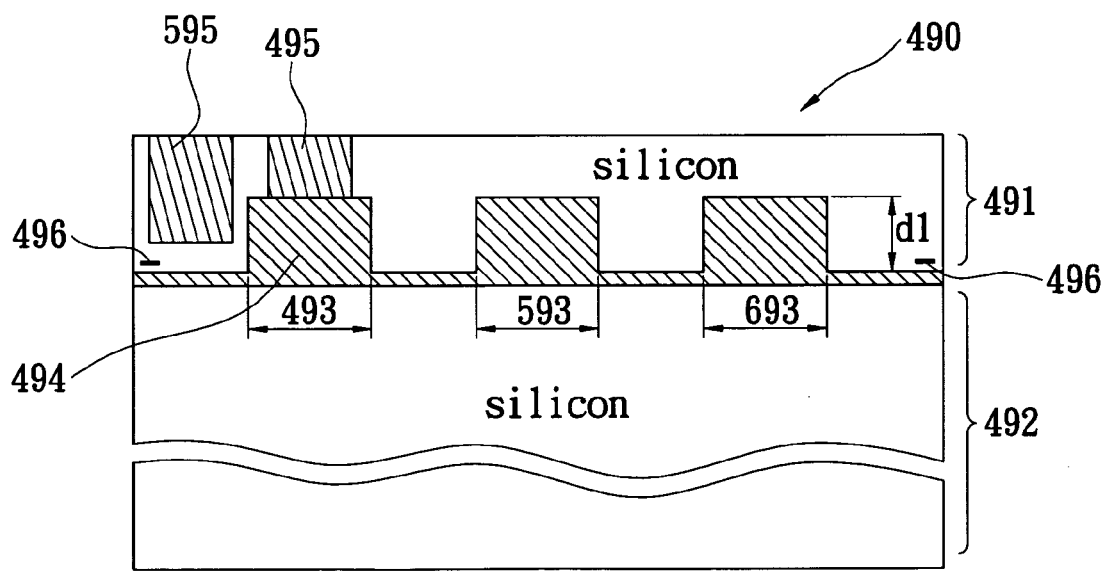
FIG. 9 is a schematic diagram illustrating an eighth embodiment according to the present invention.

Reference is made to FIG. 9, which is a schematic diagram showing an eighth embodiment 490 according to the present invention. The SOI chip structure 490 includes a first silicon layer (wafer) 491 and a second silicon layer (wafer) 492 under the first silicon layer 491 after being bonded with the first silicon layer 491. Buried oxide areas 493, 593, and 693 with the depth d1 are located at the predetermined positions of the first wafer 491, and are supposed to be filled with an amorphous silicon oxide 494, preferably a spin-on glass, SOG, in this case. In this embodiment, buried oxide areas 493, 593, and 693 are completely filled with the amorphous silicon oxide 494 (SOG), and serves as the insulating layer between the first and second silicon layers 491 and 492 and the adhesive applicable to wafer bonding these two silicon layers 491 and 492. SOI devices 495 and 595 placed on the first silicon layer 491 further require the setting of via holes (not shown) so as to have operating voltages thereof refer to the second silicon layer (ground layer) 492. With the setting of these buried oxide areas 493, 593, and 693, this SOI chip structure 490 also becomes a SOI chip structure with a dual-thickness silicon layer, rendering the placement of different kinds of SOI devices 495 and 595 appropriate. As in the aforementioned embodiments, at least one pair of alignment marks 496 are included and placed on the first silicon layer 491, the purpose thereof having already been mentioned before and thus omitted from this paragraph.

Figure 10:
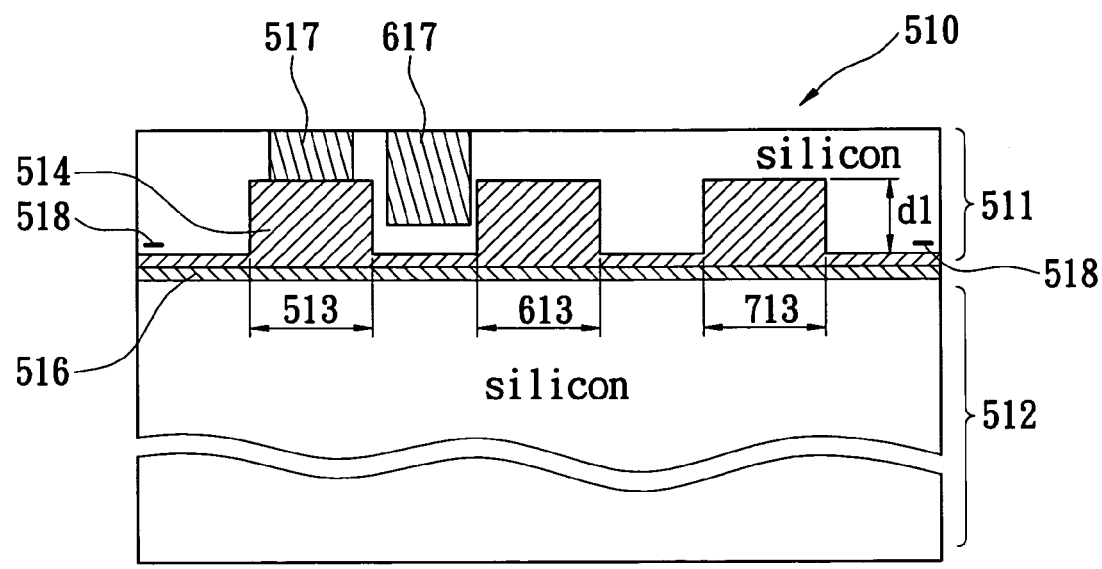
FIG. 10 is a schematic diagram illustrating a ninth embodiment according to the present invention.

Reference is made to FIG. 10, which is a schematic diagram showing a ninth embodiment 510 according to the present invention. The SOI chip structure 510 includes a first silicon layer (wafer) 511 and a second silicon layer (wafer) 512 under the first silicon layer 511 after being bonded with the first silicon layer 511. Buried oxide areas 513, 613, and 713 with the depth d1 are located at the predetermined positions of the first wafer 511, and are supposed to be filled with an amorphous silicon oxide 514. In this case, part of the amorphous silicon oxide is formed between the positions of these buried oxide areas 513, 613, and 713. The amorphous silicon oxide 514 filling buried oxide areas 513, 613, and 713 serves as an insulating layer between the first and second silicon layers 511 and 512. A SOG layer 516 is further included and formed between the first and second silicon layers 511 and 512 also, serving as an adhesive for use in wafer bonding the first and second silicon layers 511 and 512. SOI devices 517 and 617 placed on the first silicon layer 511 further require the setting of via holes (not shown) so as to have operating voltages thereof refer to the second silicon layer (ground layer) 512. With the setting of these buried oxide areas 513, 613, and 713, this SOI chip structure 510 also becomes a SOI chip structure with a dual-thickness silicon layer, rendering the placement of different kinds of SOI devices 517 and 617 appropriate. As in aforementioned embodiments, at least one pair of alignment marks 518 are included and placed on the first silicon layer 511.

Figure 11:
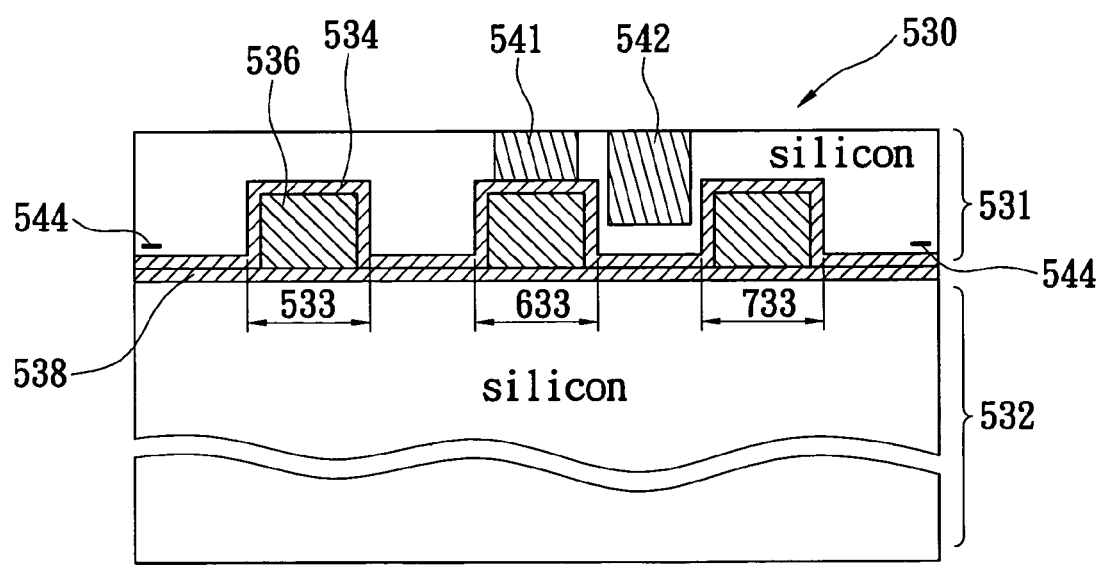
FIG. 11 is a schematic diagram illustrating a tenth embodiment according to the present invention.

Reference is made to FIG. 11, which is a schematic diagram showing a tenth embodiment 530 according to the present invention. The SOI chip structure 530 includes a first silicon layer (wafer) 531 and a second silicon layer (wafer) 532 under the first silicon layer 531 after being bonded with the first silicon layer 531. Buried oxide areas 533, 633, and 733 with the depth d1 are located at the predetermined positions of the first wafer 531, and are supposed to be partially filled with an amorphous silicon oxide 534. Therefore, buried oxide areas 533, 633, and 733 are filled with a metal layer 536 before the first silicon layer 531 is flipped for further wafer bonding. A part of the amorphous silicon oxide 534 forms between positions of these buried oxide areas 533, 633, and 733, and meanwhile, the metal layer 536 is therein thoroughly formed. The amorphous silicon oxide 534 fills these buried oxide areas 533, 633, and 733 serves as an insulating layer between the first and second silicon layers 531 and 532. A SOG layer 538 is further included and formed between the first and second silicon layers 531 and 532 also, serving as an adhesive for use in wafer bonding the first and second silicon layers 531 and 532. SOI devices 541 and 542 placed on the first silicon layer 531 further require the setting of via holes (not shown) so as to have operating voltages thereof refer to the second silicon layer (ground layer) 532. With the setting of these buried oxide areas 533, 633, and 733, this SOI chip structure 530 also becomes a SOI chip structure with a dual-thickness silicon layer, rendering the placement of different kinds of SOI devices 541 and 542 appropriate. As in aforementioned embodiments, at least one pair of alignment marks 544 are included and placed on the first silicon layer 531.

Figure 12:
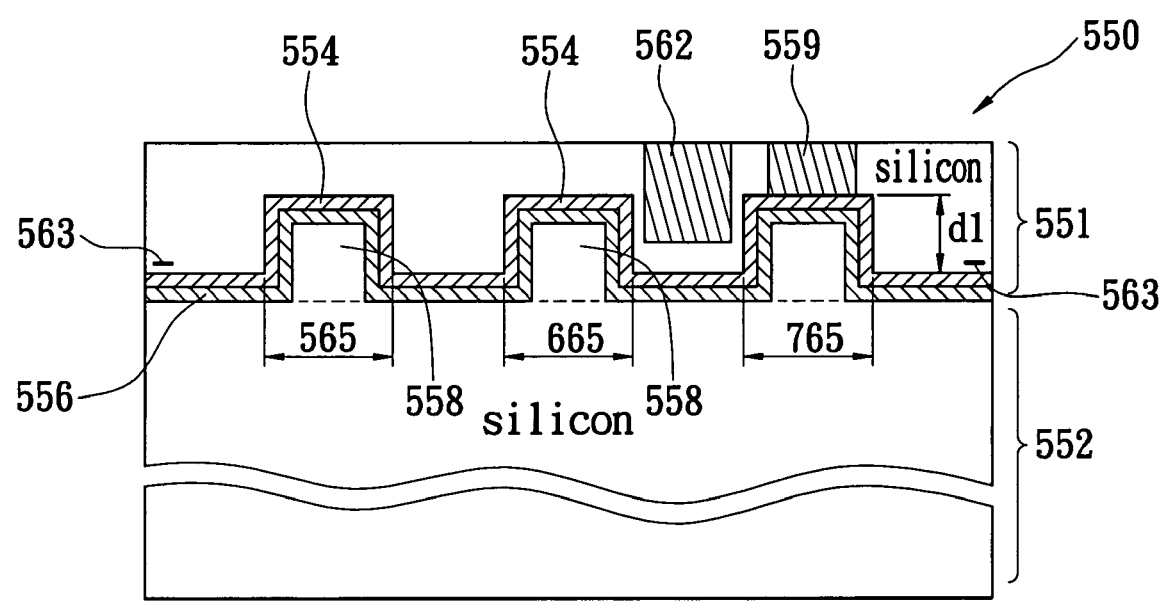
FIG. 12 is a schematic diagram illustrating an eleventh embodiment according to the present invention.

Reference is made to FIG. 12, which is a schematic diagram showing an eleventh embodiment 550 according to the present invention. The SOI chip structure 550 includes a first silicon layer (wafer) 551 and a second silicon layer (wafer) 552 under the first silicon layer 551 after being bonded with the first silicon layer 551 together. Buried oxide areas 565, 665, and 765 with the depth d1 are located at the predetermined positions of the first wafer 551, and are supposed to be partially filled with an amorphous silicon oxide 554. Furthermore, a metal layer 556 fills the remaining space of these buried oxide areas 565, 665, and 765 before the first silicon layer 531 is flipped for the use of further wafer bonding. However, the metal layer 556 still partially fills the remaining space of these buried oxide areas 565, 665, and 765 created by the incompletely filling amorphous silicon oxide 554, and in this case, air within the remaining space is evacuated, in order to form voids 558 between the metal layer 556 and the second silicon layer 552. A part of the amorphous silicon oxide 554 forms between positions of these buried oxide areas 565, 665, and 765. The amorphous silicon oxide 554 filling these buried oxide areas 565, 665, and 765 serves as an insulating layer between the first and second silicon layers 551 and 552. SOI devices 559 and 562 placed on the first silicon layer 551 further require the setting of via holes (not shown) so as to have operating voltages thereof refer to the second silicon layer (ground layer) 552. With the setting of these buried oxide areas 565, 665, and 765, this SOI chip structure 550 also becomes a SOI chip structure with a dual-thickness silicon layer, rendering the placement of different kinds of SOI devices 559 and 562 appropriate. As in aforementioned embodiments, at least one pair of alignment marks 563 are included and placed on the first silicon layer 551.

As same with the embodiment in FIG. 5, embodiments in FIGS. 6 to 12 also may vary the forming depth of buried oxide areas thereof, in order to have at least two-silicon layer thickness to meet different demands of different SOI devices.

Figure 13:
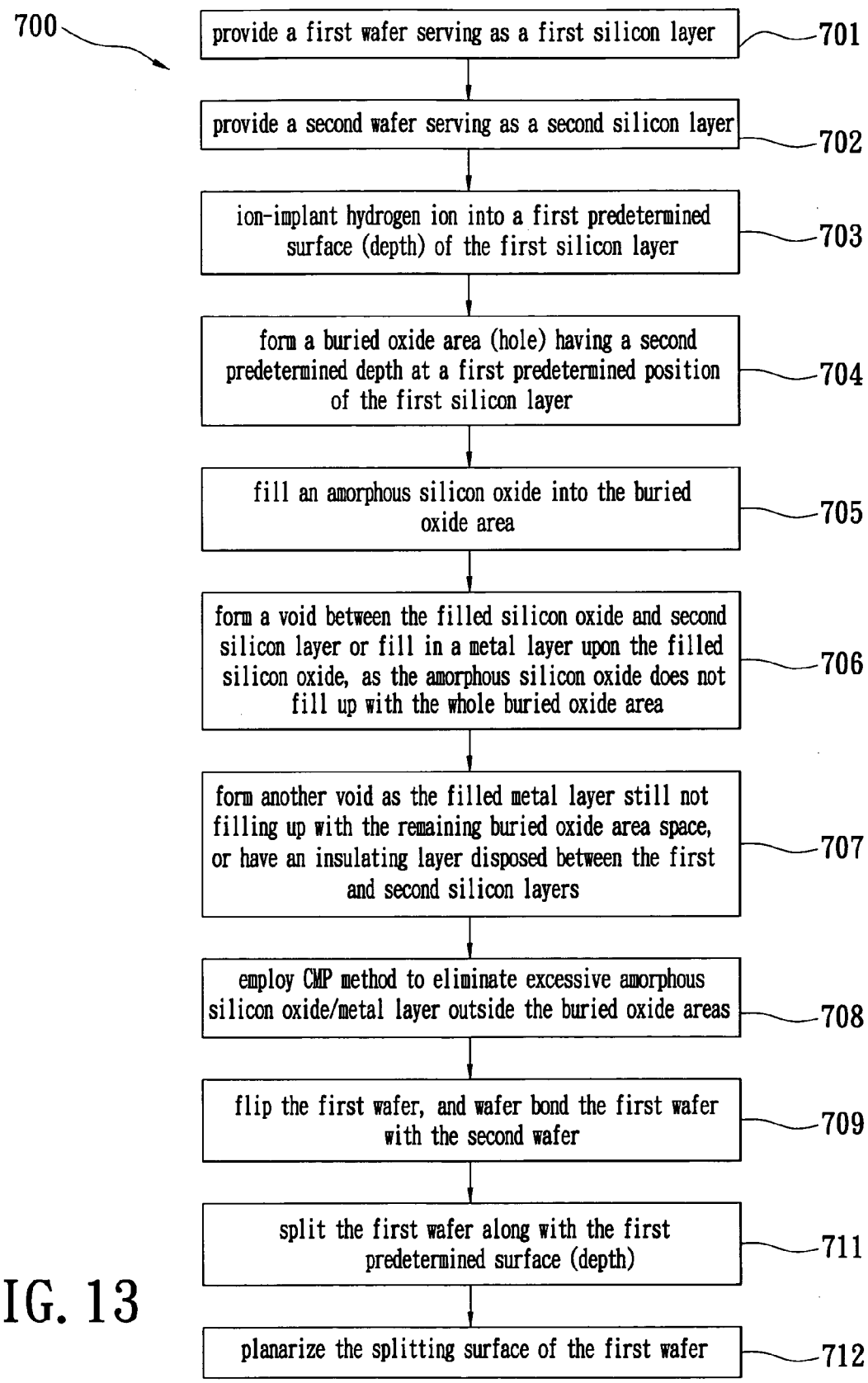
FIG. 13 is a simplified flow chart showing a manufacturing method for the SOI chip structure of the present invention.

Reference is made to FIG. 13, which is a simplified flow chart showing a manufacturing method 700 for the SOI chip structure of the present invention.

This method 700 includes steps as follows:

Step 701: provide a first wafer serving as a first silicon layer;

Step 702: provide a second wafer serving as a second silicon layer;

Step 703: ion-implant hydrogen ions to a first predetermined surface (depth) of the first silicon layer;

Step 704: form a buried oxide area (hole) having a second predetermined depth at a first predetermined position of the first silicon layer;

Step 705: fill the buried oxide area with an amorphous silicon oxide;

Step 706: form a void between the filled silicon oxide and second silicon layer or fill in a metal layer upon the filled silicon oxide, when the amorphous silicon oxide does not fill up with the whole buried oxide area;

Step 707: form another void when the filled metal layer still does not fill up the remaining buried oxide area space, or dispose an insulating layer between the first and second silicon layers;

Step 708: employ CMP to eliminate excess amorphous silicon oxide/metal layer outside the buried oxide areas;

Step 709: flip the first wafer, and wafer bond the first wafer to the second wafer;

Step 711: split the first wafer along with the first predetermined surface (depth); and Step 712: planarize the split surface of the first wafer.

The present invention SOI chip structure includes two separate wafers bonded together, including a first wafer serving as an active device layer to have SOI devices placed thereon and a second wafer serving as a ground layer. In general, the method begins with the process for the first wafer, but, however, is not limited to that order. The simplified method in FIG. 13 only provides a preferred embodiment, indicative of a wide variety of different combinations when it comes to the order of performing steps thereof. In step 703, hydrogen ions are implanted to a first predetermined depth (surface) of the first wafer, which is also the reference plane (surface) for splitting the first wafer splitting with the water jet. Thereafter, the buried oxide areas having a second predetermined depth at first predetermined positions are formed, for filling with amorphous silicon oxide material, in order to have buried oxide layer (BOX) formed at these buried oxide areas. Amorphous silicon oxide is not itself conductive, thus serving as an insulating layer. SOI devices are located above the insulating buried oxide layer. The depth of buried oxide areas is not limited to only one depth, but depends instead on the requirements of SOI devices. The embodiment shown in FIG. 5 provides buried oxide areas (at the third predetermined positions) having another (second) predetermined depth d2. The insulating layer preferably consists of an amorphous silicon oxide, which selectively completely fills or doesn't fill buried oxide areas. In cases where some space of the buried oxide areas is partially filled, a metal layer or a void may be employed, as described in Steps 706 and 708. Still, Step 707 is a selective step, which can be performed upon embodiments shown in FIGS. 6 to 11.

FIGS. 2 to 5 provide a SOI chip structure having the first and second silicon layers electrically connected to each other in a direct relationship, without the necessity of having conductive via holes placed and the step of forming the insulating layer (Step 707) between every buried oxide area. Embodiments in FIGS. 9 to 12 provide a SOI chip structure having the insulating layer thereof formed at the same time the amorphous silicon layer fills these buried oxide areas. FIGS. 6 to 8 provide other possible preferred embodiments of the present invention, where the insulating layer (preferably, a thermal oxide layer) between buried oxide areas is different from the amorphous silicon oxide material filled into these buried oxide areas, rendering simultaneous formation of the insulating layer and buried oxide layer impossible. Furthermore, Step 708 is also a selective step.

Regardless of whether the amorphous silicon oxide or the metal layer fills the buried oxide areas, in the wake of above filling, some planarizing steps are required, so as to readily facilitate following steps to be preformed. Amorphous silicon oxide material can be a SOG material, which also plays the role of adhering the first wafer to the second one. For the purpose of having the stepper and the mask infrastructure have no difficulty in aligning with operating wafers, at least one pair of alignment marks is provided and placed on the surface of the first wafer. The CMP method for planarization and the hydrogen annealing for repairing damaged lattices are also necessary after the step of splitting the first wafer is finished.

In contrast to the prior art, the present invention provides a SOI single crystalline chip structure consisting of two bonded separated wafers. And, with the placement of buried oxide areas having different depths, SOI devices end up placed on different silicon layer thicknesses. Besides, a metal layer is or is not employed between the first and second wafers in order to establish or prevent direct electrical connection between these two separated wafers, accordingly. With the setting of the metal layer, heat dissipation performances for SOI devices on the SOI chip structure in this case are superior to their counterparts having no metal layer placed on corresponding SOI chip structures.

Those skilled in the art will readily observe that numerous modifications and alterations of the device may be made while retaining the teaching of the invention. Accordingly, the above disclosure should be construed as limited only by metes and bounds of the appended claims.

What is claimed is:

1. A SOI (silicon on insulator) single crystalline chip structure comprising:

a first silicon layer having at least one SOI device placed thereon;

at least one buried oxide area with a predetermined depth being placed at a predetermined position of said first silicon layer, to enable said first silicon layer to have at least two different silicon thicknesses, said buried oxide area being filled with a silicon oxide material serveing as an insulating area;

a second silicon layer below said first silicon layer and said buried oxide area; and a pair of alignment marks on said first silicon layer;

wherein said first silicon layer and said second silicon layer are directly electrically connected.

2. The SOI single crystalline chip structure of claim 1, further comprising a metal layer between said first silicon layer and said second silicon layer.

3. The SOI single crystalline chip structure of claim 2, wherein said metal layer is a single-layer metal or a multi-layer metal compound.

4. The SOI single crystalline chip structure of claim 2, wherein said metal layer is placed between said first silicon layer and said second silicon layer as said silicon oxide material fills said whole buried oxide area.

5. The SOI single crystalline chip structure of claim 2, wherein said metal layer fills said buried oxide area when said silicon oxide material does not fill said whole buried oxide area.

6. The SOI single crystalline chip structure of claim 5, further comprising a void area between said metal layer filling said buried oxide area and said second silicon layer.

7. The SOI single crystalline chip structure of claim 1, wherein said silicon oxide material is an amorphous silicon oxide material.

8. The SOI single crystalline chip structure of claim 1, wherein said alignment marks are for alignment purposes.

9. A SOI single crystalline chip structure comprising:
- a first silicon layer for having at least one SOI device placed thereon;
- at least one buried oxide area with a predetermined depth being placed at a predetermined position of said first silicon layer, to enable said first silicon layer to have at least two different silicon thicknesses, said buried oxide area being filled with a silicon oxide material;
- a second silicon layer below said first silicon layer and said buried oxide area;
- an insulating layer between said first silicon layer and said second silicon layer;
- a pair of alignment marks on said first silicon layer; and
- a metal material layer between said first silicon layer and said second silicon layer.

10. The SOI single crystalline chip structure of claim 9, wherein said silicon oxide material fills said whole buried oxide area.

11. The SOI single crystalline chip structure of claim 9, wherein said silicon oxide material only partially fills said buried oxide area.

12. The SOI single crystalline chip structure of claim 9, wherein said metal layer fills said buried oxide area.

13. The SOI single crystalline chip structure of claim 9, wherein said metal layer is a single-layer metal or a multi-layer metal compound.

14. The SOI single crystalline chip structure of claim 9, further comprising a void area formed between said silicon oxide material filling said buried oxide area and said second silicon layer.

15. The SOI single crystalline chip structure of claim 9, wherein said insulating layer is a thermal oxide layer.

16. The SOI single crystalline chip structure of claim 9, wherein said silicon oxide material is an amorphous silicon oxide material.

17. The SOI single crystalline chip structure of claim 16, wherein said amorphous silicon oxide material is a spin-on glass.

18. The SOI single crystalline chip structure of claim 17, wherein a part of said spin-on glass is located between said first silicon layer and said second silicon layer.

19. The SOI single crystalline chip structure of claim 9, further comprising a spin-on glass layer formed between said first silicon layer and said second silicon layer, for wafer bonding said first silicon layer and said second silicon layer.

20. The SOI single crystalline chip structure of claim 9, wherein said insulating layer is said silicon oxide material outside said buried oxide area.

\* \* \* \* \*